United States Patent
Seo (10) Patent No.: US 8,951,874 B2
(45) Date of Patent: Feb. 10, 2015

(54) SEMICONDUCTOR DEVICE AND MANUFACTURING METHOD THEREOF

(75) Inventor: Eisuke Seo, Miyagi (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 426 days.

(21) Appl. No.: 13/032,863

(22) Filed: Feb. 23, 2011

(65) Prior Publication Data

US 2011/0204451 A1   Aug. 25, 2011

(30) Foreign Application Priority Data

Feb. 24, 2010   (JP) ................. 2010-038962

(51) Int. Cl.
H01L 27/088   (2006.01)
H01L 21/336  (2006.01)
H01L 29/423  (2006.01)
H01L 29/78   (2006.01)

(52) U.S. Cl.
CPC ............ H01L 29/4238 (2013.01); H01L 29/78 (2013.01)
USPC ........... 438/296; 438/401; 438/410; 438/417; 438/197; 257/344; 257/390; 257/392; 257/401; 257/E21.409; 257/E27.061

(58) Field of Classification Search
USPC .......... 257/392, E21.409, E27.061, 344, 390, 257/394; 438/197, 296
See application file for complete search history.

(56) References Cited

U.S. PATENT DOCUMENTS

| | | | |
|---|---|---|---|
| 2002/0081820 A1 | 6/2002 | Ikeda | |
| 2006/0205166 A1* | 9/2006 | Ishikiriyama | 438/299 |
| 2007/0145495 A1 | 6/2007 | Curello et al. | |
| 2008/0017865 A1 | 1/2008 | Itoh et al. | |
| 2009/0134454 A1* | 5/2009 | Takeuchi et al. | 257/327 |
| 2010/0041199 A1 | 2/2010 | Anderson et al. | |

FOREIGN PATENT DOCUMENTS

| | | |
|---|---|---|
| JP | H10-65153 A | 3/1998 |
| JP | 2000-340791 A | 12/2000 |

(Continued)

OTHER PUBLICATIONS

An Office Action, Notice of Reasons for Rejection, issued by the Japanese Patent Office on Jan. 28, 2014, which corresponds to Japanese Patent Application No. 2010-038962 and is related to U.S. Appl. No. 13/032,863; with English language translation.

*Primary Examiner* — Lynne Gurley
*Assistant Examiner* — Vernon P Webb
(74) *Attorney, Agent, or Firm* — Studebaker & Brackett PC (57) ABSTRACT

Disclosed is a semiconductor device manufacturing method comprising: forming an element isolation region in one principal face of a semiconductor substrate of one conductivity type; forming a gate electrode extending from an element region to the element isolation region at both sides of the element region in a first direction, both end portions of the gate electrode in the first direction being on the element isolation region and respectively including a concave portion and protruding portions at both sides of the concave portion; carrying out ion implantation of impurities of the one conductivity type from a direction tilted from a direction perpendicular to the one principal face toward the first direction so that first and second impurity implantation regions of the one conductivity type are formed in the one principal face in two end regions of the element region in the first direction.

5 Claims, 9 Drawing Sheets

(56) References Cited

FOREIGN PATENT DOCUMENTS

| JP | 2003-046088 A | 2/2003 |
| JP | 2004-288873 A | 10/2004 |
| JP | 2006-080548 A | 3/2006 |
| JP | 2006-128160 A | 5/2006 |
| JP | 2008-028117 A | 2/2008 |
| JP | 2009-267027 A | 11/2009 |

* cited by examiner

SEMICONDUCTOR DEVICE AND MANUFACTURING METHOD THEREOF

CROSS-REFERENCE TO RELATED APPLICATION

This application claims priority under 35 USC 119 from Japanese Patent Application No. 2010-038962 filed on Feb. 24, 2010, the disclosure of which is incorporated by reference herein.

BACKGROUND

1. Field of the Invention

The present invention relates to a semiconductor device and a manufacturing method thereof, and more particularly to a semiconductor device having an element isolation region of a shallow trench isolation (STI) structure including a groove formed in one principal face of a semiconductor substrate and an insulator filled in the groove, and also to a manufacturing method of the semiconductor device.

2. Related Art

Generally, a MOS transistor having an element isolation structure such as an STI structure causes a parasitic transistor, of which the threshold voltage is lower than that of a central portion of an element region, to be easily formed at an end portion of the element region in which a gate electrode overlaps with an element isolation region. Owing to the parasitic transistor as formed, hump properties occur. The hump properties exhibit ones having deviations from the original properties of the MOS transistor, and reduce a circuit operating margin (refer to Japanese Patent Application Laid-Open (JP-A) No. 2004-288873).

In order to prevent occurrence of hump properties, the above-described patent document discloses a structure in which the gate electrode is branched off at an end portion of the element region. Due to the branched gate electrode structure being formed, a region having no gate electrode formed therein is formed at an end portion of the element region, so that a parasitic transistor is not operated in this region.

However, in a structure in which the gate electrode is branched off at the end portion of the element region as described above, a channel width becomes smaller so that current driving force is reduced, whereby there arises a problem that an element area in the channel widthwise direction would increase in order to obtain a predetermined current driving force.

SUMMARY

It is a main object of the present invention to provide a semiconductor device that is capable of improving hump properties while restraining an increase of the element area, and a manufacturing method of the semiconductor device.

According to a first aspect of the present invention, there is provided a manufacturing method of a semiconductor device, comprising:

forming an element isolation region in one principal face of a semiconductor substrate of one conductivity type;

forming a gate dielectric film on the one principal face of the semiconductor substrate;

selectively forming a gate electrode on the gate dielectric film, the gate electrode extending from an element region surrounded by the element isolation region to the element isolation region at both sides of the element region in a first direction, both sides of the gate electrode being separated from the element isolation region in a second direction orthogonal to the first direction, and both end portions of the gate electrode in the first direction being on the element isolation region and each including a concave portion and protruding portions at both sides of the concave portion;

carrying out ion implantation of impurities of the one conductivity type from a direction tilted from a direction perpendicular to the one principal face toward the first direction so that first and second impurity implantation regions of the one conductivity type are respectively formed in the one principal face in two end regions, which contact the element isolation region, of the element region in the first direction, through the concave portions at the both end portions of the gate electrode in the first direction, the first and second impurity implantation regions being respectively separated from both ends of the gate electrode in the second direction; and forming first and second impurity regions of an opposite conductivity type in the element region at both sides of the gate electrode in the second direction.

According to a second aspect of the present invention, there is provided a semiconductor device, comprising:

a semiconductor substrate of one conductivity type; an element isolation region in one principal face of the semiconductor substrate, and an element region surrounded by the element isolation region;

a gate dielectric film on the one principal face of the semiconductor substrate;

a gate electrode that is formed on the gate dielectric film so as to extend from the element region to the element isolation region at both sides of the element region in a first direction, both sides of the gate electrode in a second direction orthogonal to the first direction being respectively separated from the element isolation region, and both end portions of the gate electrode in the first direction being disposed on the element isolation region and respectively including a concave portion and protruding portions at both sides of the concave portion;

first and second impurity regions of the one conductivity type respectively provided in the one principal face in two end regions of the element region in the first direction, the two end regions contacting the element isolation region, the first and second impurity regions of the one conductivity type being respectively separated from both ends of the gate electrode in the second direction; and first and second impurity regions of an opposite conductivity type respectively formed in the element region at both sides of the gate electrode in the second direction.

BRIEF DESCRIPTION OF THE DRAWINGS

An exemplary embodiment of the present invention will be described in detail referring to the following figures, wherein.

DETAILED DESCRIPTION

A preferred embodiment of the present invention will be hereinafter described with reference to the attached drawings.

As shown in FIG. 1 to FIG. 4, a photoresist (not shown) is selectively formed on one principal face 101 of a p-type silicon (Si) substrate 100, and with the formed photoresist serving as a mask, a groove (trench) 31 is formed in the principal face 101 of the substrate 100 using a dry etching method.

Then, the groove 31 is filled with an insulator 32, and thereafter, the surface is planarized, whereby a trench element isolation dielectric layer 30 that is an element isolation region is formed. A region surrounded by the trench element isolation dielectric layer 30 becomes an element region 50.

Next, a gate dielectric film 40 is formed on the surface of the semiconductor substrate 100, which is exposed in the element region 50, and on the trench element isolation dielectric layer 30.

Then, a gate electrode 10 is selectively formed on the gate dielectric film 40. The gate electrode 10 is made of polysilicon or the like. The thickness of the gate electrode 10 is, for example, 3000 Å.

The gate electrode 10 extends, from the element region 50 onto the trench element isolation dielectric layers 30 at both sides of the element region 50, in a direction indicated by an arrow 112. The gate electrode 10 is provided with both end portions 11, 12 in a direction indicated by an arrow 112. The both end portions 11, 12 is provided on the trench element isolation dielectric layer 30. The both end portions 11, 12 have concave portions 13, 14, respectively, and also have protruding portions 15, 16, and 17, 18, respectively, at both sides of the concave portions 13, 14, respectively. A distance X from each of boundaries 51, 52 between the element region 50 and the trench element isolation dielectric layer 30 to each of ends 19, 20, 21, and 22 of the protruding portions 15, 16, 17, 18, respectively, in the direction indicated by the arrow 112 is, for example, 0.3 μm, and a distance Y from each of the boundaries 51, 52 of the element region 50 and the trench element isolation layer 30 to each of ends 23, 24 of the concave portions 13, 14, respectively, in the direction indicated by the arrow 112 is, for example, 0.2 μm. Both sides of the gate electrode 10 in the direction indicated by the arrow 111 which is orthogonal to the direction of the arrow 112 are separated from the trench element isolation dielectric layers 30, respectively. Note that the direction indicated by the arrow 112 coincides with a gate width direction, and the direction indicated by the arrow 111 coincides with a gate length direction.

Next, as shown in FIGS. 5 to 8, the gate electrode 10 and a portion of the element region 50 which is not covered by the gate electrode 10 are covered by a resist 60, and ion implantation of p-type impurities (for example, boron) is carried out, for example, on the conditions of 60 keV and Tilt=45°, so that impurity implantation regions 71, 72 are formed in a self-aligning manner with respect to the gate electrode 10. The impurity implantation regions 71, 72 function as a parasitic channel suppressing p-type layer.

Namely, ion implantation 70 of p-type impurities is carried out from a direction indicated by an arrow 114 that is tilted from a direction indicated by an arrow 113 orthogonal to the principal face 101 of the semiconductor substrate 100 toward the direction indicated by the arrow 112 by an angle of 45°, and the impurity implantation regions 71 and 72 are formed in the one principal face 101 of two end regions 53, 54, respectively, through the concave portions 13, 14 of the both end portions 11, 12 of the gate electrode 10 in the direction indicated by the arrow 112.

The two end regions 53, 54 are provided in the element region 50 in the direction indicated by the arrow 112, and the two end regions 53, 54 contact the trench element isolation dielectric layers 30, respectively.

The p-type impurities are implanted into the end regions 53, 54 of the element region 50 through the concave portions 13, 14 of the end portions 11, 12, respectively, of the gate electrode 10, while the p-type impurities are not implanted via the protruding portions 15, 16 at both sides of the concave portion 13 and the protruding portions 17, 18 at both sides of the concave portion 14. Consequently, the impurity implantation regions 71, 72 are formed in a self-aligning manner with respect to the gate electrode 10. The impurity implantation regions 71, 72 are separated from the end 25 of the gate electrode 10 in the direction indicated by the arrow 111 by distance D1, and separated from the end 26 of the electrode 10 by distance D2.

The dosage of ion implantation is, for example, $2 \times 10^{11}$ $cm^{-2}$ in such a degree that decreases of thresholds of parasitic transistors in the end regions 53, 54 of the element region 50 are compensated, and channels are formed in the end regions 53, 54 of the element region 50 under a predetermined threshold voltage application condition. Preferably, the dosage of ion implantation is set such that the threshold voltages of the parasitic transistors of the end regions 53, 54 of the element region 50 become the same as the threshold voltage of a transistor formed in a central region 55 between the end regions 53, 54 of the element region 50. Ion implantation is carried out while rotating the semiconductor substrate 100.

Next, as shown in FIG. 9 to FIG. 12, the resist 60 is removed, and thereafter, ion implantation of n-type impurities (for example, phosphor) is carried out with the gate electrode 10 serving as a mask, and a source region 81 and a drain region 82, such as a low concentration layer of LDD (lightly doped drain), are formed in the element regions 50 at the both side of the gate electrode 10 in the direction indicated by the arrow 111, in a self-aligning manner with respect to the gate electrode 10. The impurity implantation regions 71, 72 serving as parasitic channel suppressing p-type layers are separated from the drain region 82 by distance D3, and are separated from the source region 81 by distance D4.

In the preferred embodiment of the present invention, a structure in which a region having no electrode is formed by branching off the gate electrode 10 is not employed, and the gate electrode is formed in the gate width direction (in the direction indicated by the arrow 112) entirely in the element region 50. Therefore, the hump property of the MOS transistor can be suppressed while the increase of the element area caused by forming the impurity implantation regions 71, 72 serving as parasitic channel suppressing p-type layers is restrained.

Furthermore, the impurity implantation regions 71, 72 serving as parasitic channel suppressing p-type layers are formed in a self-aligning manner with respect to the gate electrode 10, and the source region 81 and the drain region 82 are also formed in a self-aligning manner with respect to the gate electrode 10. Therefore, it is possible to prevent reduction of a resistant voltage due to mask misalignment when the impurity implantation regions 71 and 72 are formed. Therefore, the present embodiment can be suitably applied particularly to a high-voltage resistant MOS transistor.

Next, with reference to FIGS. 13 to 16, a manufacturing method of a MOS transistor according to a comparative example will be described.

Figure 1:
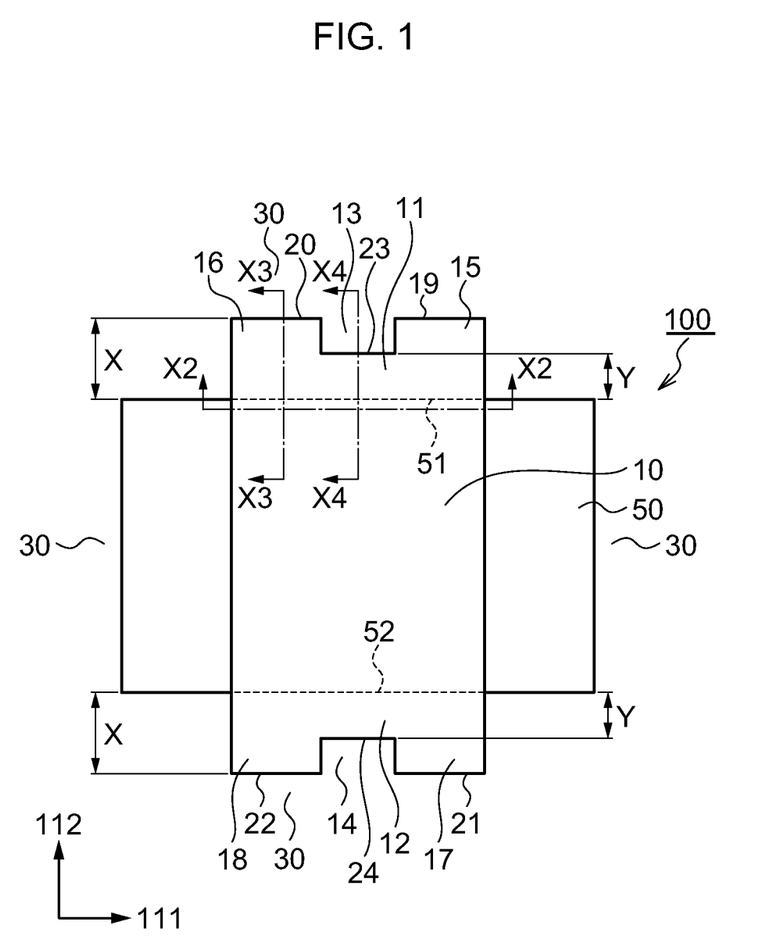
FIG. 1 is a schematic plan view for explaining a manufacturing method of a semiconductor device according to a preferred embodiment of the present invention.
Figure 2:
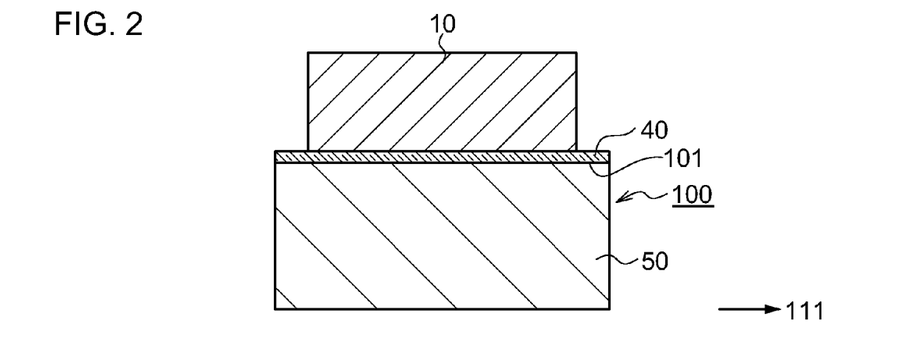
FIG. 2 is a schematic longitudinal cross-sectional view taken along line X2-X2 in FIG. 1.
Figure 3:
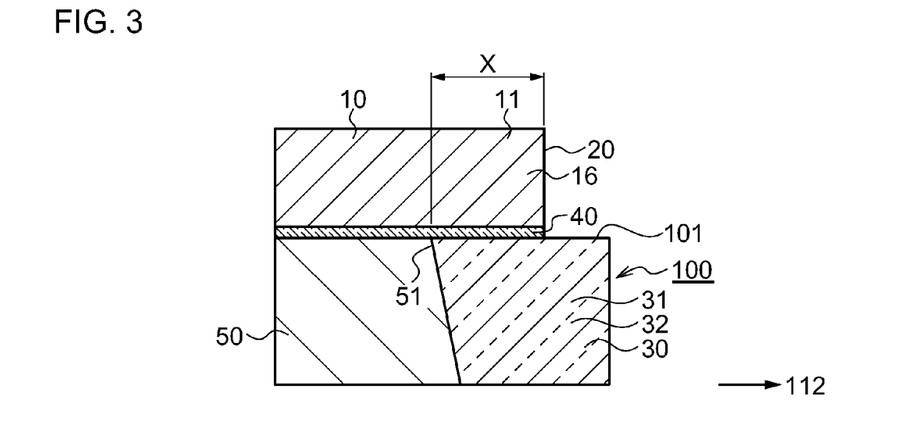
FIG. 3 is a schematic longitudinal cross-sectional view taken along line X3-X3 in FIG. 1.
Figure 4:
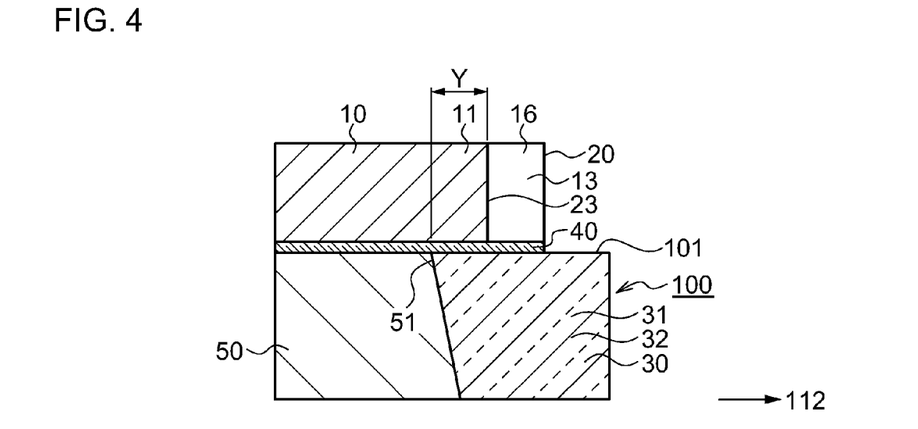
FIG. 4 is a schematic longitudinal cross-sectional view taken along line X4-X4 in FIG. 1.
Figure 5:
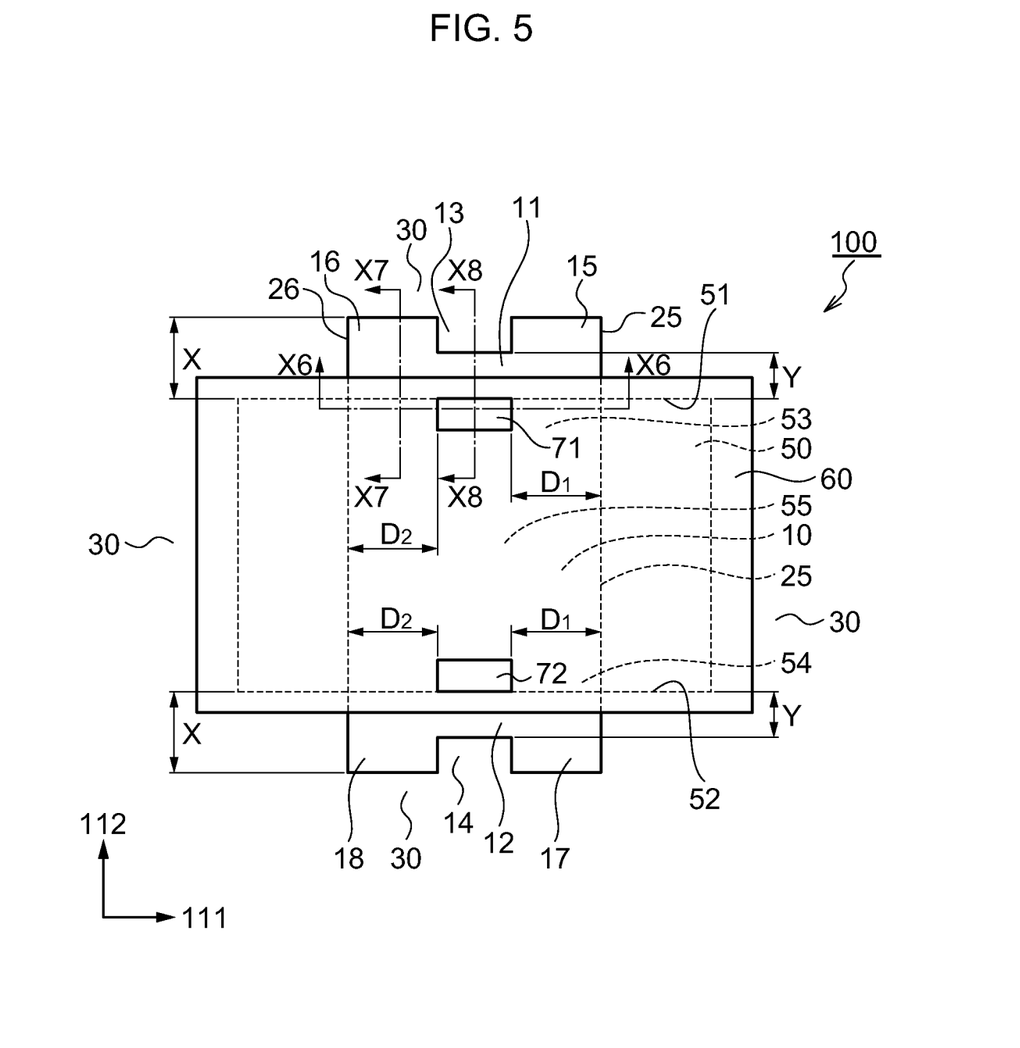
FIG. 5 is a schematic plan view for explaining the manufacturing method of the semiconductor device according to the preferred embodiment of the present invention.
Figure 6:
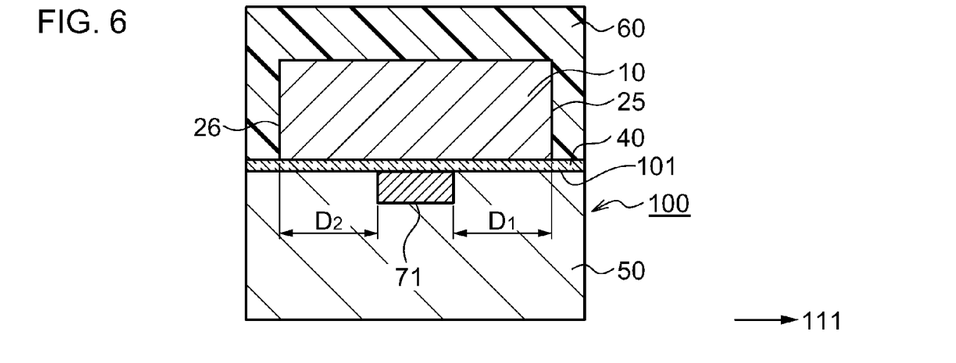
FIG. 6 is a schematic longitudinal cross-sectional view taken along line X6-X6 in FIG. 5.
Figure 7:
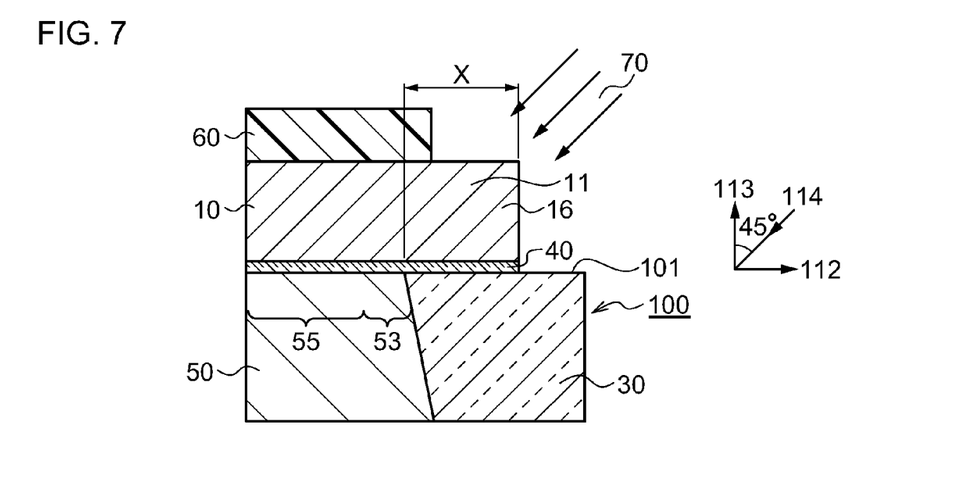
FIG. 7 is a schematic longitudinal cross-sectional view taken along line X7-X7 in FIG. 5.
Figure 8:
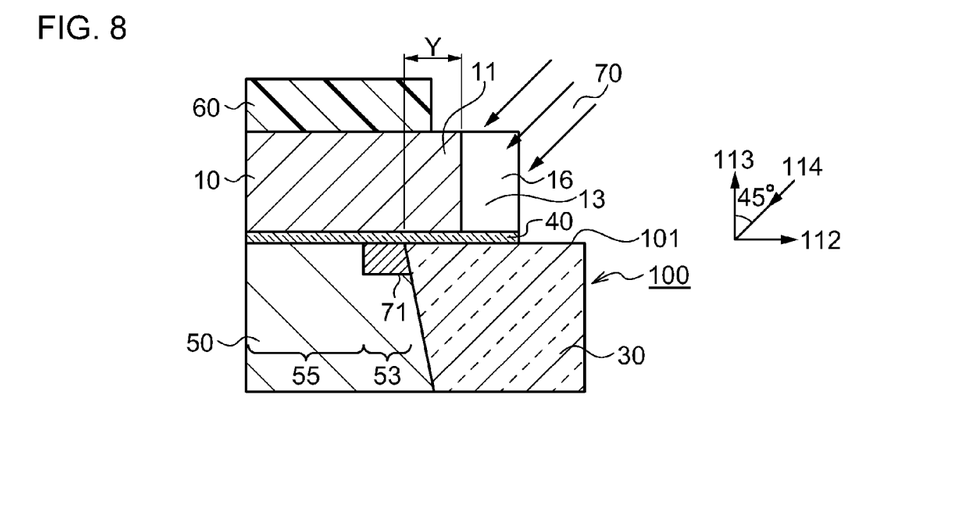
FIG. 8 is a schematic longitudinal cross-sectional view taken along line X8-X8 in FIG. 5.
Figure 9:
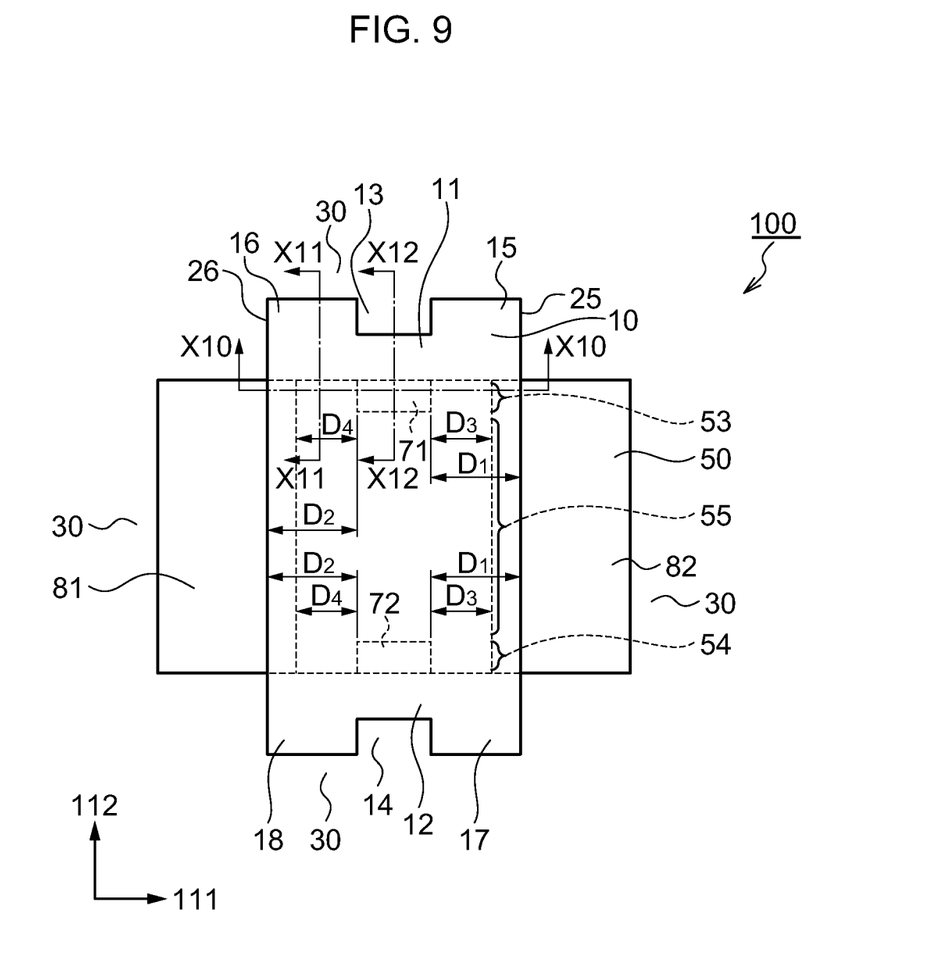
FIG. 9 is a schematic plan view for explaining the manufacturing method of the semiconductor device according to the preferred embodiment of the present invention.
Figure 10:
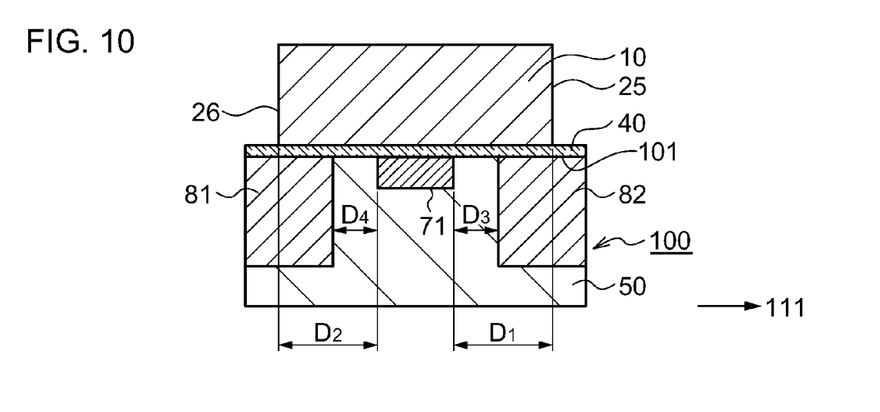
FIG. 10 is a schematic longitudinal cross-sectional view taken along line X10-X10 in FIG. 9.
Figure 11:
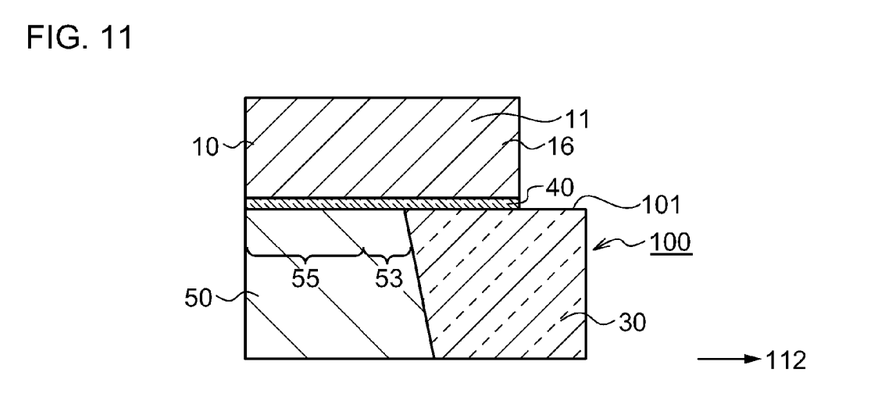
FIG. 11 is a schematic longitudinal cross-sectional view taken along line X11-X11 in FIG. 9.
Figure 12:
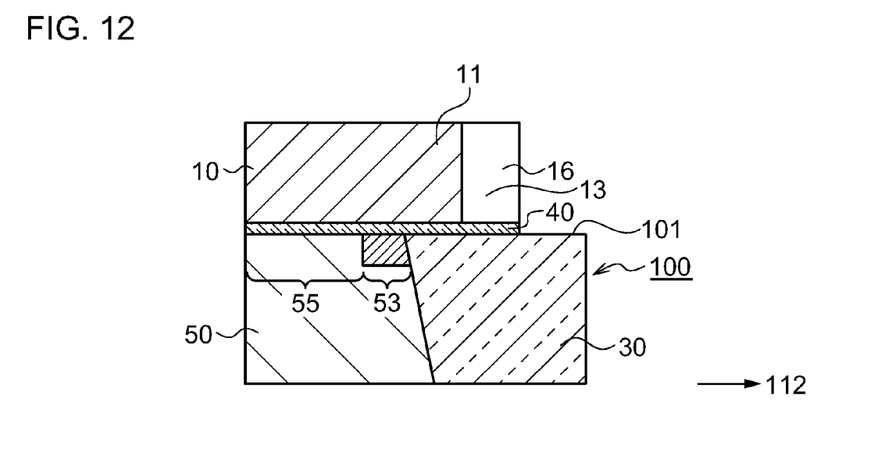
FIG. 12 is a schematic longitudinal cross-sectional view taken along line X12-X12 in FIG. 9.
Figure 13:
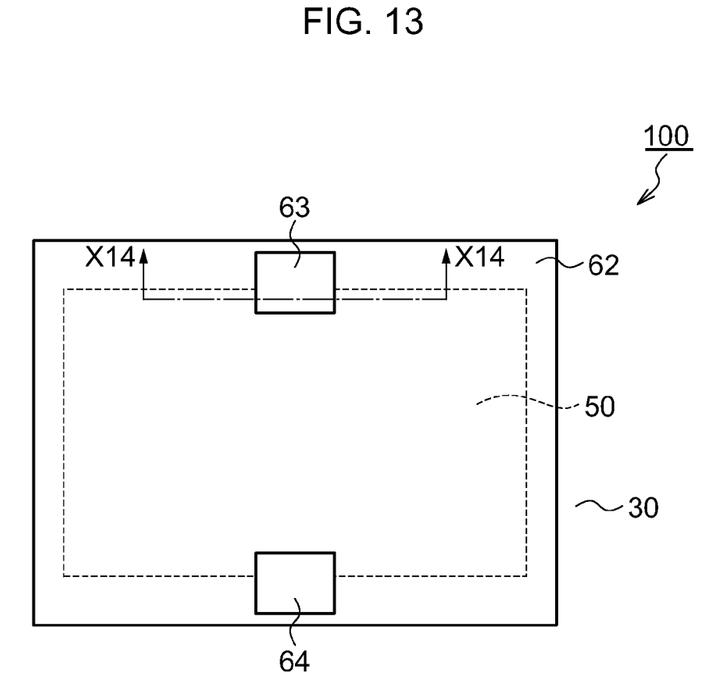
FIG. 13 is a schematic plan view for explaining a manufacturing method of a semiconductor device according to a comparative example.
Figure 14:
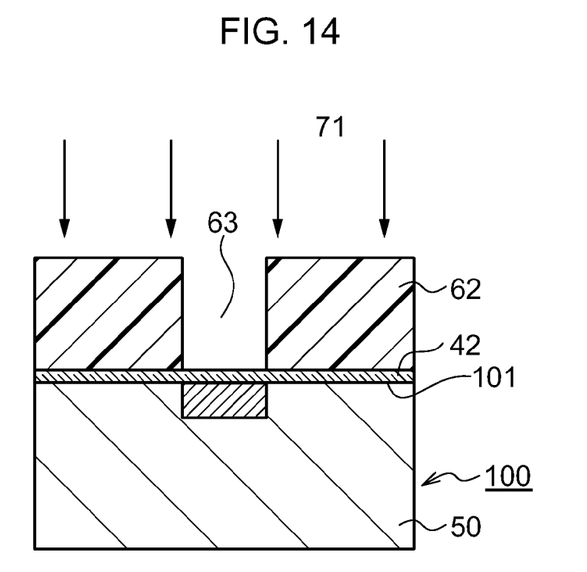
FIG. 14 is a schematic longitudinal cross-sectional view taken along line X14-X14 in FIG. 13.

As shown in FIG. 13 and FIG. 14, a photoresist (not shown) is selectively formed on one principal face 101 of a p-type silicon substrate 100, and with the formed photoresist serving as a mask, a groove (trench) 31 is formed by a dry etching method on the principal face 101 of the substrate 100.

Then, the groove 31 is filled with an insulator 32, and thereafter, the surface is planarized, whereby a trench element isolation dielectric layer 30 that is an element isolation region is formed. A region surrounded by the trench element isolation dielectric layer 30 becomes an element region 50.

Subsequently, a thermal oxide film 42 is formed so as to have a thickness of, for example, 300 Å, and thereafter, a resist pattern 62 having openings 63, 64 is formed using a photolithographic technique. Afterwards, ion implantation of p-type impurities (for example, boron) is carried out with the resist pattern 62 serving as a mask, and the impurity implantation regions 73, 74 serving as parasitic channel suppressing p-type layers are formed. At this time, ion implantation dosage is set to, for example, $1 \times 10^{11}$ cm$^{-2}$ in such a degree as to compensate for decrease of a threshold of a parasitic transistor at the end portion of the element region and form a channel at the end portion of the element region under a predetermined threshold value voltage application condition. Further, the resist pattern 62 is formed such that distance D between the impurity implantation regions 73, 74 and each of source region 85 and a drain region 86 (refer to FIG. 15 and FIG. 16) is maintained.

Figure 15:
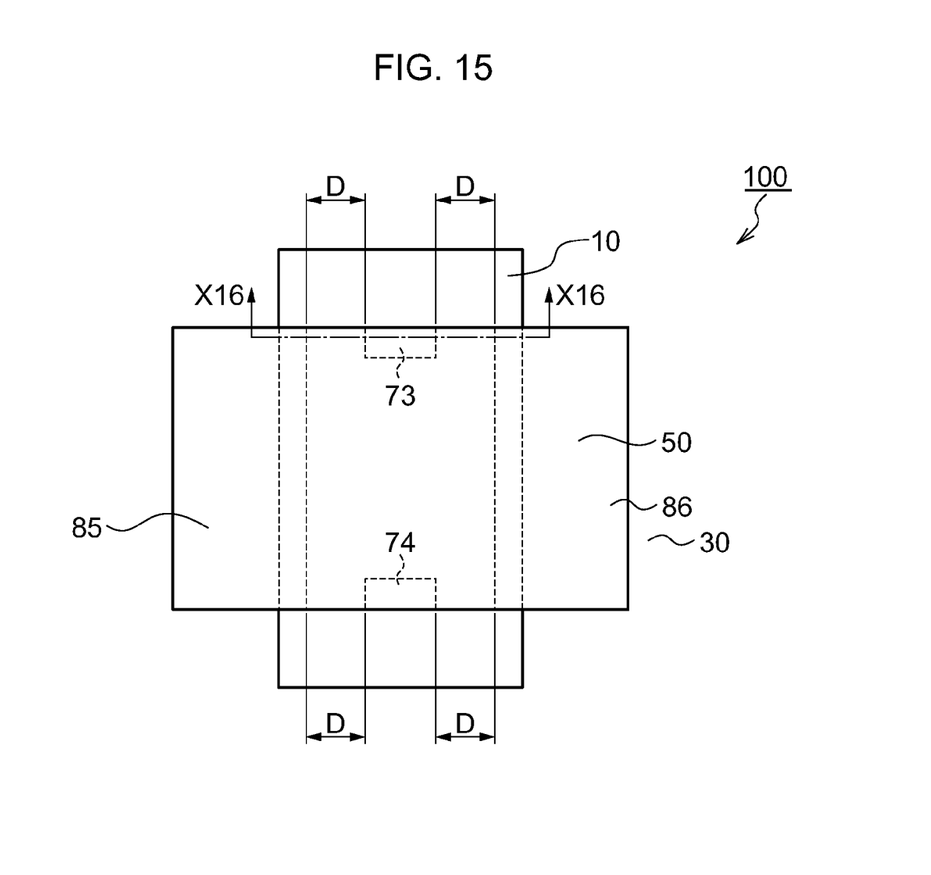
FIG. 15 is a schematic plan view for explaining the manufacturing method of the semiconductor device according to the comparative example.
Figure 16:
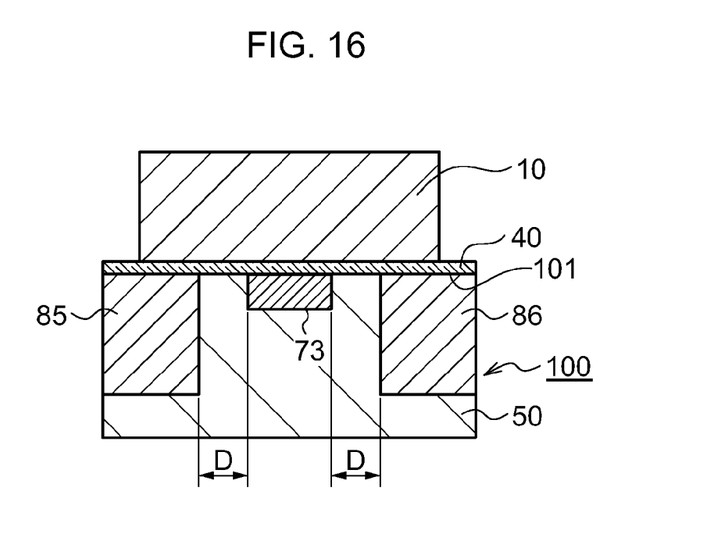
FIG. 16 is a schematic longitudinal cross-sectional view taken along line X16-X16 in FIG. 15.

Then, as shown in FIG. 15 and FIG. 16, a gate dielectric film 40 is formed in the element region 50 of the semiconductor substrate 100, which is exposed in the element region 50, and on the trench element isolation dielectric layer 30.

And then, the gate electrode 10 made of polysilicon or the like is formed on the gate dielectric film 40. Subsequently, ion implantation of n-type impurities (for example, phosphor) is carried out with the gate electrode 10 serving as a mask, and the source region 85 and the drain region 86 such as low concentration LDD layers or the like are formed in a self-aligning manner with respect to the gate electrode 10.

Figure 17:
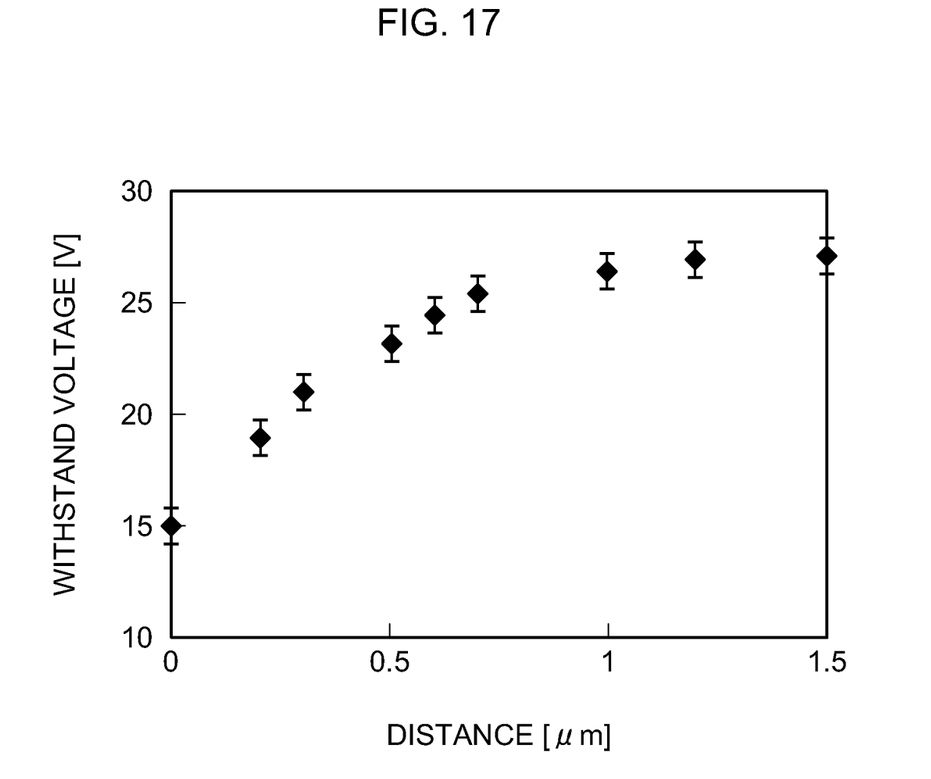
FIG. 17 is a diagram showing a relationship between a resistant voltage and a distance between an impurity implantation region formed at an end portion of an element region and a drain.

In the above-described manufacturing method, there exists a problem that under the influence of misalignment when the impurity implantation regions 73, 74 serving as parasitic channel suppressing p-type layers are formed, distance D between the impurity implantation regions 73, 74 and the drain region 86 becomes smaller, thereby reducing resistant voltage as shown in FIG. 17.

In the above-described embodiment, the embodiment which is applied to the n-type MOS transistor is described, however, by replacing the n-type with the p-type, the present embodiment can also be applied to a transistor of the opposite conductivity type.

Further, an example in which the STI element isolation process is applied in the present embodiment is described, but the present embodiment can also be applied to the LOCOS (Local Oxidation of Silicon) element isolation process.

Although various exemplary embodiments have been shown and described, the invention is not limited to the embodiments shown. Therefore, the scope of the invention is intended to be limited solely by the scope of the claims that follow.

What is claimed is:

1. A manufacturing method of a semiconductor device, comprising:
    forming an element isolation region in one principal face of a semiconductor substrate of one conductivity type;
    forming a gate dielectric film on the one principal face of the semiconductor substrate;
    selectively forming a gate electrode on the gate dielectric film, the gate electrode extending from an element region surrounded by the element isolation region to the element isolation region at both sides of the element region in a gate width direction, each end portion in the gate width direction of the gate electrode being located on the element isolation region and including a portion located at a first distance from a boundary between the element isolation region in proximity to the end portion and the element region, the portion located at the first distance being located outside the boundary and in the element isolation region and a plurality of protruding portions located at a second distance from the boundary that is longer than the first distance, and the plurality of protruding portions sandwiching the portion located at the first distance and being located outside the boundary and in the element isolation region;
    carrying out ion implantation of impurities of the one conductivity type from a direction tilted from a direction perpendicular to the one principal face toward the gate width direction so that first and second impurity implantation regions of the one conductivity type are respectively formed in the one principal face in two end regions, which contact the element isolation region, of the element region in the gate width direction, through the portion between the plurality of protruding portions provided at one of the end portions of the gate electrode, the first and second impurity implantation regions being respectively separated from both ends of the gate electrode in a gate length direction; and
    forming source and drain regions of an opposite conductivity type that is opposite conductivity type of the one conductivity type in the element region at both sides of the gate electrode in the gate length direction, the source and drain regions being respectively separated from the first and second impurity implantation regions.

2. The manufacturing method of a semiconductor device according to claim 1, wherein in the ion implantation of the impurities of the one conductivity type, ions of the impurities of the one conductivity type are not implanted into the one principal face of the element region through the plurality of protruding portions.

3. The manufacturing method of a semiconductor device according to claim 1, wherein the forming of the element isolation region and the element region surrounded by the element isolation region includes: forming a groove in the one principal face of the semiconductor substrate and filling the groove with an insulator.

4. The manufacturing method of a semiconductor device according to claim 1, wherein in the ion implantation of the impurities of the one conductivity type, the ion implantation of the impurities of the one conductivity type is carried out in such a manner that at least the element region that is not covered by the gate electrode is covered by a resist.

5. The manufacturing method of a semiconductor device according to claim 1, wherein in the ion implantation of the impurities of the one conductivity type, a dosage of the ion implantation of the impurities is set such that threshold voltages of transistors that are formed in the two end regions of the element region in the gate width direction become substantially the same as a threshold voltage of a transistor that is formed between the two end regions of the element region in the gate width direction.

* * * * *